(12) United States Patent
Matsubayashi

(10) Patent No.: US 9,956,643 B2
(45) Date of Patent: May 1, 2018

(54) PRESSURE APPLYING UNIT

(71) Applicant: SHINDENGEN ELECTRIC MANUFACTURING CO., LTD., Chiyoda-ku, Tokyo (JP)

(72) Inventor: Ryo Matsubayashi, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days. days.

(21) Appl. No.: 15/122,925

(22) PCT Filed: Mar. 31, 2015

(86) PCT No.: PCT/JP2015/060297
§ 371 (c)(1),
(2) Date: Sep. 1, 2016

(87) PCT Pub. No.: WO2016/157465
PCT Pub. Date: Oct. 6, 2016

(65) Prior Publication Data
US 2017/0066075 A1     Mar. 9, 2017

(51) Int. Cl.
*B23K 1/00*     (2006.01)
*B23K 20/02*    (2006.01)
(Continued)

(52) U.S. Cl.
CPC .......... *B23K 20/023* (2013.01); *B23K 1/0016* (2013.01); *B23K 20/002* (2013.01);
(Continued)

(58) Field of Classification Search
CPC .... H05K 3/325; H05K 13/00; H05K 13/0465; B23K 1/0016; B30B 15/067; B30B 15/34; B30B 7/02
(Continued)

(56) References Cited

U.S. PATENT DOCUMENTS 3,151,862 A    10/1964  Nicosia
5,592,021 A *   1/1997  Meschter ............ H01L 23/4006
                                              257/726
(Continued)

FOREIGN PATENT DOCUMENTS

JP     2010-114208 A    5/2010
JP      2012-9703 A     1/2012
JP     2015-56550 A     3/2015

OTHER PUBLICATIONS

International Search Report in PCT/JP2015/060297, dated Jun. 9, 2015.
(Continued)

*Primary Examiner* — Erin B Saad
(74) *Attorney, Agent, or Firm* — Hauptman Ham, LLP

(57) ABSTRACT

Provided is a pressure applying unit used in baking a metal particle paste of an assembled body formed by arranging an electronic part on a substrate with the metal particle paste interposed therebetween by heating the assembled body while applying pressure to the assembled body using a pair of heating parts. The pressure applying unit includes: a pair of transferring members which transfers pressure and heat to the assembled body by sandwiching the assembled body therebetween; guide members which movably connect the pair of transferring members to each other; and a distance adjusting mechanism being configured to make the second transferring member separated from the assembled body during a pressure non-applying time and brings both the first transferring member and the second transferring member into contact with the assembled body during a pressure applying time.

6 Claims, 7 Drawing Sheets

(51) Int. Cl.
    *H01L 21/52* (2006.01)
    *B23K 20/00* (2006.01)
    *B23K 20/26* (2006.01)
    *H01L 23/00* (2006.01)
    *B23K 101/40* (2006.01)

(52) U.S. Cl.
    CPC .............. *B23K 20/26* (2013.01); *H01L 21/52* (2013.01); *H01L 24/75* (2013.01); *B23K 2201/40* (2013.01); *H01L 2224/753* (2013.01); *H01L 2224/75754* (2013.01)

(58) Field of Classification Search
    USPC .... 228/179.1, 212, 213, 44.7; 100/199, 305, 100/325, 38
    See application file for complete search history.

(56) References Cited

U.S. PATENT DOCUMENTS

| | | | |
|---|---|---|---|
| 2010/0024667 A1* | 2/2010 | Ikura | ..................... B30B 15/067 100/38 |
| 2010/0330776 A1 | 12/2010 | Zuniga et al. | |
| 2011/0049221 A1 | 3/2011 | Blais et al. | |
| 2012/0247664 A1 | 10/2012 | Kobayashi | |
| 2015/0257280 A1 | 9/2015 | Ciliox et al. | |
| 2016/0126215 A1 | 5/2016 | Imbert et al. | |

OTHER PUBLICATIONS

International Search Report in PCT/JP2015/060296, dated Jun. 9, 2015.
International Search Report in PCT/JP2015/060290, dated Jun. 9, 2015.
International Search Report in PCT/JP2015/060286, dated Jun. 9, 2015.
Kaye and Laby http://www.kayelaby.npl.co.uk/general_physics/ 2_3/2_3_7.html May 22, 2016, 11pp.
Restriction Requirement in U.S. Appl. No. 15/122,926, dated May 26, 2017.
Restriction Requirement in U.S. Appl. No. 15/122,927, dated Apr. 11, 2017.
Engineering Toolbox (www. engineeringtoolbox. com) Aug. 1, 2017, 3pp.
Euro Inox Stainless Steel: Tables of Technical Properties, 2007, 24pp.
Office Action in U.S. Appl. No. 15/122,926, dated Aug. 7, 2017, 18pp.
Office Action in U.S. Appl. No. 15/122,927, dated Sep. 22, 2017, 23pp.
Office Action in U.S. Appl. No. 15/122,929, dated Jul. 28, 2017, 16pp.
Office Action in U.S. Appl. No. 15/122,926, dated Jan. 23, 2018, 18pp.
Office Action in U.S. Appl. No. 15/122,929, dated Jan. 8, 2018, 20pp.

* cited by examiner

PRESSURE APPLYING UNIT

RELATED APPLICATIONS

The present application is a National Stage of PCT International Application No. PCT/JP2015/060297, filed Mar. 31, 2015.

TECHNICAL FIELD

The present invention relates to a pressure applying unit which is used in baking a metal particle paste of an assembled body formed by arranging an electronic part on a substrate with the metal particle paste interposed therebetween by heating the assembled body while applying pressure to the assembled body using a pair of heating parts.

BACKGROUND ART

In a technical field of electronic products, there has been known a bonded body where a substrate and an electronic part are bonded to each other by a baked metal particle paste. As a specific example of such a bonded body, it is possible to name a semiconductor device where a substrate on which a conductor pattern is formed and a semiconductor element are bonded to each other by a baked metal particle paste (see patent literature 1, for example).

The above-mentioned bonded body is described with reference to drawings. As shown in FIG. 1(a) and FIG. 1(b) a bonded body 10 includes a substrate 1, an electronic part 2 and a baked metal particle paste 3.

The substrate 1 is a printed circuit board on which a conductor pattern is formed, for example.

The electronic part 2 is a semiconductor element, for example.

The baked metal particle paste 3 is a paste obtained by baking a metal particle paste 4 described later.

The substrate 1, the electronic part 2 and the metal particle part 4 are described in detail in the embodiment 1 described later.

Conventionally, the above-mentioned bonded body 10 is manufactured by the following method, for example.

Firstly, an assembled body 20 is prepared as shown in FIG. 7 (first step).

The assembled body 20 is obtained by arranging the electronic part 2 on the substrate 1 with the metal particle paste 4 interposed therebetween.

Next, as shown in FIG. 8, the assembled body 20 is arranged between a pair of heating parts (heating plates) 1000, 1002 (second step). In the method of manufacturing a bonded body described here, the heating part 1000 is arranged on a lower side and hence, the assembled body 20 is arranged on an upper surface of the heating part 1000.

The pair of heating parts 1000, 1002 is arranged at positions where the pair of heating parts 1000, 1002 faces each other in an opposed manner, and the heating parts 1000, 1002 are heated by a heating mechanism not shown in the drawing. Further, the pair of heating parts 1000, 1002 is configured such that the heating part 1002 is moved toward the heating part 1000 by a pressure applying mechanism part not shown in the drawing and hence, a pressure can be applied to an object sandwiched between the pair of heating parts 1000, 1002.

Thereafter, as shown in FIG. 9, the heating part 1002 is moved toward the heating part 1000, and the assembled body 20 is heated while being applied with pressure using the pair of heating parts 1000, 1002 thus baking the metal particle paste 4 whereby the bonded body 10 (see FIG. 1(a) and FIG. 1(b)) is manufactured (third step).

According to the conventional method of manufacturing a bonded body, the metal particle paste 4 can be baked by heating the assembled body 20 while applying pressure to the assembled body 20 using the pair of heating parts 1000, 1002 and hence, the substrate 1 and the electronic part 2 can be bonded to each other.

CITATION LIST

Patent Literature

Patent Literature 1: JP-A-2012-9703

SUMMARY OF INVENTION

Technical Problem

However, in the conventional method of manufacturing a bonded body, before heating the assembled body 20 while applying pressure to the assembled body 20 using the pair of heating parts 1000, 10002, heat is transferred to the metal particle paste 4 from the heating part 1000 thus giving rise to a possibility that a sintering reaction (solidifying reaction) occurs in a portion of the metal particle paste 4. When a sintering reaction occurs in the portion of the metal particle paste 4, there arises a possibility that a baked metal particle paste 3 cannot acquire sufficient density and strength. As a result, there arises a possibility that bonding property between the substrate 1 and the electronic part 2 is lowered.

To suppress the occurrence of such a partial sintering reaction of the metal particle paste, it may be considered reasonable to cool the heating parts at the time of arranging the assembled body and to heat the heating parts after pressure is applied to the assembled body using the pair of heating parts. However, both heating of the heating parts and cooling of the heating parts require a considerable time and hence, when a temperature of heating part is changed each time the assembled body is arranged, there arises a possibility that productivity of the assembled body is remarkably lowered.

The present invention has been made in view of the above-mentioned drawbacks, and it is an object of the present invention to provide a pressure applying unit to be used in a method of manufacturing a bonded body which can suppress the lowering of bonding property between a substrate and an electronic part and which can prevent the remarkable lowering of productivity of a bonded body.

Solution to Problem

Inventors of the present invention have, in view of the above-mentioned drawbacks, invented a method of manufacturing a bonded body which can suppress the lowering of bonding property between a substrate and an electronic part and which can prevent the remarkable lowering of productivity of a bonded body.

To simply describe the method of manufacturing a bonded body, an assembled body is heated while being applied with pressure by means of a pressure applying unit (see respective embodiments described later, particularly the embodiment 1). According to the method of manufacturing a bonded body, with the use of the pressure applying unit, it is possible to suppress unintended heat conduction to a metal particle paste from a heating part and hence, it is possible to acquire the above-mentioned advantageous effects.

The present invention is the invention relating to a pressure applying unit to be used in the above-mentioned method of manufacturing a bonded body, and the present invention is formed of the following constitutional elements.

[1]

A pressure applying unit according to the present invention is a pressure applying unit used in baking a metal particle paste of an assembled body formed by arranging an electronic part on a substrate with the metal particle paste interposed therebetween by heating the assembled body while applying pressure to the assembled body using a pair of heating parts, wherein assuming a time during which pressure is not applied to the pressure applying unit as a pressure non-applying time and a time during which predetermined pressure is applied to the pressure applying unit as a pressure applying time, the pressure applying unit includes: a pair of transferring members which is constituted of a plate-like first transferring member being in contact with the substrate at least during the pressure applying time and a plate-like second transferring member being in contact with the electronic part at least during the pressure applying time and transfers pressure and heat to the assembled body by sandwiching the assembled body therebetween in sintering the metal particle paste; a guide member which connects the pair of transferring members to each other, and allows the movement of at least one transferring member out of the first transferring member and the second transferring member while keeping parallelism of one transferring member with the other transferring member; and a distance adjusting mechanism for adjusting a distance between the first transferring member and the second transferring member, the distance adjusting mechanism being configured to, in a state where the assembled body is arranged between the pair of transferring members, make the first transferring member or the second transferring member separated from the assembled body during the pressure non-applying time and brings both the first transferring member and the second transferring member into contact with the assembled body during the pressure applying time.

[2]

In the pressure applying unit according to the present invention, it is preferable that the distance adjusting mechanism include a resilient member which extends during the pressure non-applying time, and shrinks during the pressure applying time.

[3]

In the pressure applying unit according to the present invention, it is preferable that the resilient member be formed of a coil spring, and be arranged using the guide member as a shaft.

[4]

In the pressure applying unit according to the present invention, it is preferable that one end portion of the guide member be fixed to the first transferring member, a guide member receiving hole which conforms to the guide member be formed in the second transferring member, and the second transferring member be movable along the guide member inserted into the guide member receiving hole.

[5]

In the pressure applying unit according to the present invention, it is preferable that the other end portion of the guide member disposed on a side opposite to one end portion of the guide member be disposed in the guide member receiving hole during the pressure applying time.

[6]

In the pressure applying unit according to the present invention, it is preferable that the other end portion of the guide member disposed on a side opposite to one end portion of the guide member be configured to project from the guide member receiving hole toward a side of the second transferring member on a side opposite to the first transferring member during the pressure applying time, and the second transferring member further include a spacer having a thickness larger than a length by which the guide member projects from the guide member receiving hole on a side of the second transferring member where the guide member projects.

[7]

In the pressure applying unit according to the present invention, it is preferable that the pressure applying unit include four or more guide members, and when the guide members are viewed in a direction perpendicular to a surface of the first transferring member on which the substrate is arranged, the guide members be arranged at apexes of a predetermined quadrangular shape surrounding a place where the assembled body is to be arranged.

Advantageous Effects of Invention

According to the pressure applying unit of the present invention, the pressure applying unit includes the pair of transferring members. Accordingly, by interposing the transferring members between the assembled body and the pair of heating members during a pressure applying time, unintended heat conduction from the heating part to the metal particle paste can be suppressed and hence, it is possible to suppress the occurrence of a partial sintering reaction (solidifying reaction) of the metal particle paste. As a result, it is possible to suppress the lowering of bonding property between the substrate and the electronic part.

Further, according to the pressure applying unit of the present invention, the pressure applying unit suppresses unintended heat conduction from the heating part to the metal particle paste as described above. Accordingly, it is possible to arrange the assembled body without changing a temperature of the heating part thus preventing remarkable lowering of productivity of a bonded body.

Accordingly, the pressure applying unit according to the present invention forms a pressure applying unit which is used in a method of manufacturing a bonded body which can suppress the lowering of bonding property between the substrate and the electronic part and which can prevent the remarkable lowering of productivity of a bonded body.

Further, the pressure applying unit of the present invention includes the guide member. Accordingly, even when the pair of transferring members is moved due to applying of pressure, parallelism between the pair of transferring members can be kept. As a result, it is possible to suppress the occurrence of irregularities in bonding strength between the substrate and the electronic part depending on places.

The pressure applying unit of the present invention includes the distance adjusting mechanism. Accordingly, it is possible to prevent the transfer of vibrations or an impact applied to the pair of transferring members during a pressure non-applying time. As a result, it is possible to reduce the displacement of the positional relationship between the substrate and an electronic part.

BRIEF DESCRIPTION OF DRAWINGS

FIG. 1(a) is a top plan view, and FIG. 1(b) is a cross-sectional view (cross-sectional side view) taken along a line A1-A1 in FIG. 1(a).

FIG. 2(a) is a top plan view, and FIG. 2 (b) is a cross-sectional view (cross-sectional side view) taken along a line A2-A2 in FIG. 2(a). In FIG. 2(b), for facilitating the understanding of drawing, a side surface of a distance adjusting mechanism 140 is shown but not a cross section. The same goes for cross-sectional views described hereinafter.

FIG. 3(a) is a cross-sectional side view showing a state of the pressure applying unit 100 and an assembled body 20 when a pressure is not applied, and FIG. 3(b) is a cross-sectional side view showing a state where the pressure applying unit 100 and the assembled body 20 are arranged on a heating part 1000. FIG. 3(b) shows a cross section substantially equal to the cross section shown in FIG. 2(b). The same goes for FIG. 4(b), FIG. 5(a), FIG. 5(b), FIG. 6(a) and FIG. 6(b) described hereinafter.

FIG. 4(a) is a cross-sectional side view showing a state of the pressure applying unit 100 and the assembled body 20 during a pressure applying time, and FIG. 4(b) is a cross-sectional side view showing a state of the pressure applying unit 100, the assembled body 20 and a pair of heating parts 1000, 1002 at the time of heating the assembled body 20 while being applied with pressure using the pair of heating parts 1000, 1002.

FIG. 5(a) is a cross-sectional side view of the pressure applying unit 102 and an assembled body 20 during a pressure non-applying time, and FIG. 5(b) is a cross-sectional side view of the pressure applying unit 102 and the assembled body 20 during a pressure applying time.

FIG. 6(a) is a cross-sectional side view of the pressure applying unit 104 and an assembled body 22 during a pressure non-applying time, and FIG. 6(b) is a cross-sectional side view of the pressure applying unit 104 and the assembled body 22 during a pressure applying time.

FIG. 7 is a cross-sectional side view substantially equal to FIG. 1(b) showing a cross section of the bonded body. The same goes for following FIG. 8 and FIG. 9.

DESCRIPTION OF EMBODIMENTS

Figure 1A:
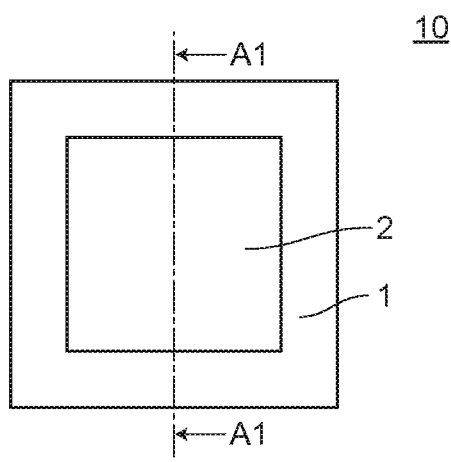
FIG. 1(a) and FIG. 1(b) are conceptual views of a bonded body 10.
Figure 1B:
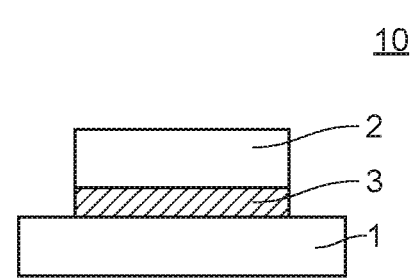

Hereinafter, a pressure applying unit of the present invention is described by reference to embodiments shown in the drawings.

Embodiment 1

Figure 7:
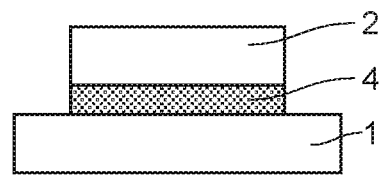
FIG. 7 is a view for explaining a first step in a conventional method of manufacturing a bonded body.
Figure 8:
FIG. 8 is a view for explaining a second step in the conventional method of manufacturing a bonded body.
Figure 8:
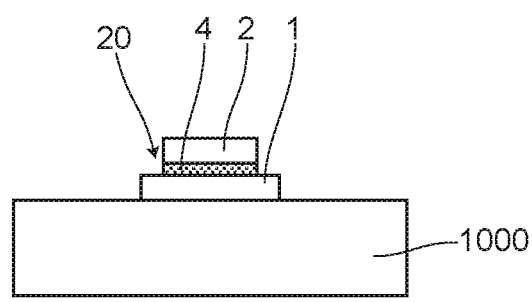
Figure 9:
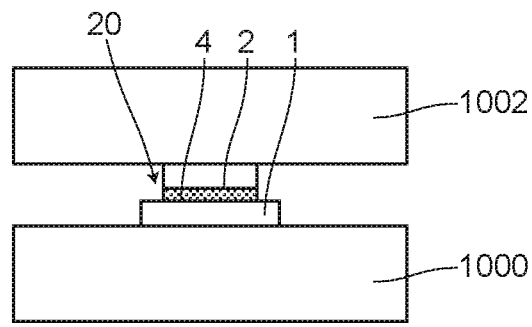
FIG. 9 is a view for explaining a third step in the conventional method of manufacturing a bonded body.

A pressure applying unit 100 according to an embodiment 1 is a pressure applying unit which is used in baking a metal particle paste 4 by heating an assembled body 20 where an electronic part 2 is arranged on a substrate 1 with the metal particle paste 4 interposed therebetween while applying a pressure to the assembled body 20 using a pair of heating parts 1000, 1002. The assembled body 20 is substantially equal to the assembled body 20 described previously (see FIG. 7) and hence, the repetition of the illustration and the explanation of the assembled body 20 is omitted.

The substrate 1, the electronic part 2 and the metal particle paste 4 are described in detail.

In this specification, "substrate" means a part on which an electronic part is mounted.

The substrate 1 mounts the electronic part 2 thereon. The substrate 1 of the embodiment 1 is, for example, a printed circuit board where a conductor pattern is formed on a body made of a non-conductive material. As a material for forming the substrate 1, a material which has resistance to a sintering temperature of the metal particle paste 4 (for example, 300° C. although the sintering temperature depends on a kind of material) can be used (for example, a resin or a ceramic having heat resistance is used for forming the body, and metal is used for forming the conductor pattern).

The substrate to which the present invention is applicable may be a DCB (Direct Copper Bond) substrate or a lead frame. Further, it is sufficient that the substrate to which the present invention is applicable is a substrate on which an electronic part can be mounted. For example, the substrate may be a silicon chip. That is, the present invention is also applicable to the connection between a silicon chip and a conductive connector.

In this specification, "electronic part" means a part which is used in an electric product and is particularly required to be electrically connected to the substrate.

The electronic part 2 is a semiconductor element, for example.

As an electronic part, besides the above-mentioned semiconductor element (for example, a semiconductor chip on which an integrated circuit is mounted), an electric motor, a resistor, a capacitor, a piezoelectric element, a connector, a switch, an antenna, and a conductive connector can be exemplified. The pressure applying unit of the present invention is particularly preferably applicable to a case where a bonded body formed by bonding at least one semiconductor element and a substrate to each other, that is, a semiconductor device is manufactured. Although the number of electronic parts 2 used in the embodiment 1 is one, the present invention is also applicable to the case where two or more electronic parts are used. When two or more electronic parts are used, the electronic parts may be formed of one kind of electronic part, or may be formed of two or more kinds of electronic parts.

The metal particle paste 4 is a conductive paste of a low-temperature sintering type which contains nano-sized or submicron-sized metal particles in a solvent, and makes use of a low-temperature sintering phenomenon and high surface activity of the metal particles. The metal particle paste 4 contains metal particles, an organic dispersion material, an organic dispersion material capturing material, and a volatile organic solvent, for example.

As the metal particles, metal nanoparticles (for example, metal particles having an average diameter of approximately 100 nm or less), metal submicron particles (for example, metal particles having an average diameter which falls within a range of from approximately 0.1 μm to approximately 1 μm), or metal particles formed of both the metal nanoparticles and the metal submicron particles can be used. As a material for forming metal particles, silver, gold or copper can be used, for example. The organic dispersion material covers surfaces of metal particles at a room temperature, and has a function of holding the metal particles in an independently dispersed state. The organic dispersion material capturing material reacts with the organic dispersion material which covers the metal particles at a high temperature and performs a function of removing the organic dispersion material from surfaces of the metal particles. The volatile organic solvent has a function of capturing a chemical reaction product formed between the organic dispersion material and the organic dispersion material capturing material and also performs a function of releasing the chemical reaction product to the outside of a system in the form of a gas.

Next, the configuration of the pressure applying unit 100 according to the embodiment 1 is explained.

Figure 2A:
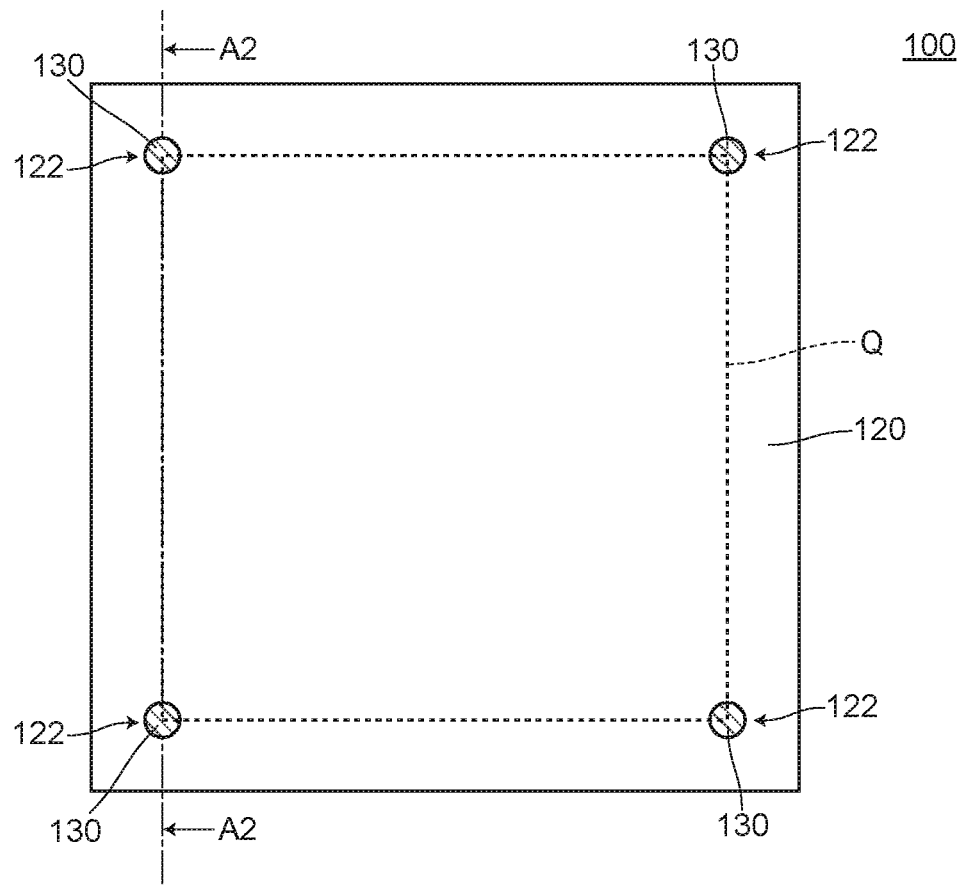
FIG. 2(a) and FIG. 2(b) are views of a pressure applying unit 100 of an embodiment 1.
Figure 2B:
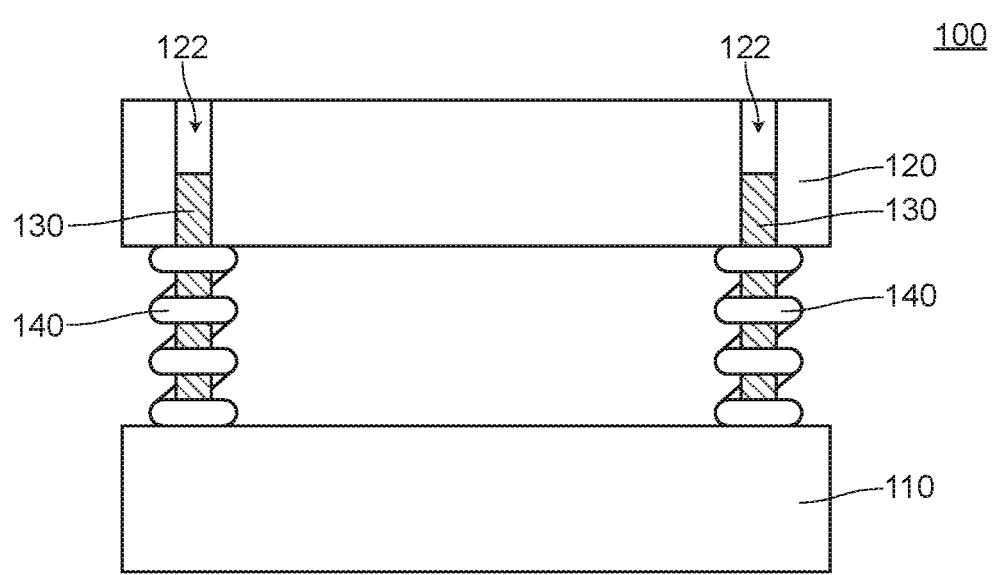

As shown in FIG. 2(a) and FIG. 2(b), the pressure applying unit 100 includes a pair of transferring members 110, 120, guide members 130, and distance adjusting mechanisms 140.

Figure 3A:
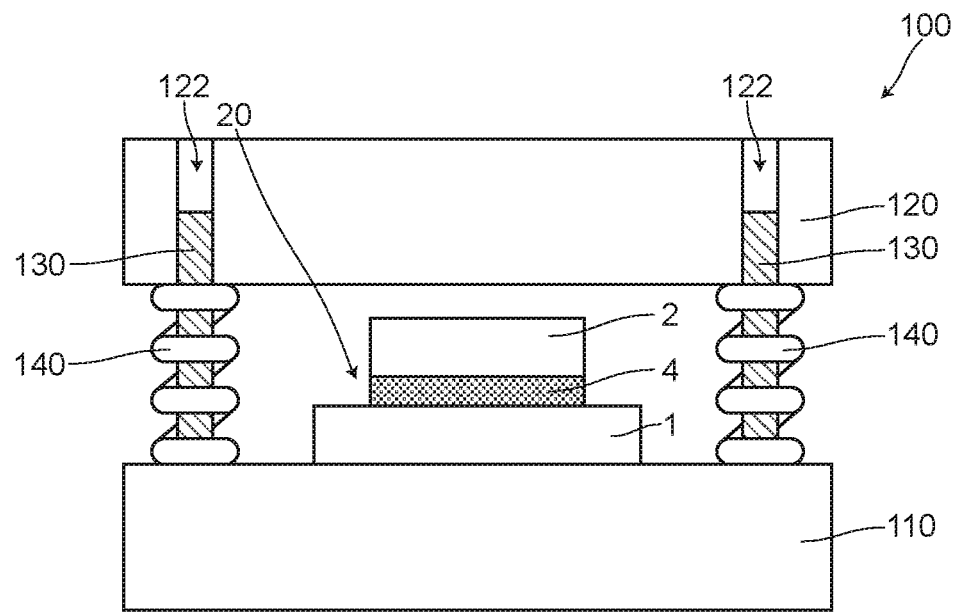
FIG. 3(a) and FIG. 3(b) are views for explaining a second step S20 in a method of manufacturing a bonded body using the pressure applying unit 100 of the embodiment 1.
Figure 4A:
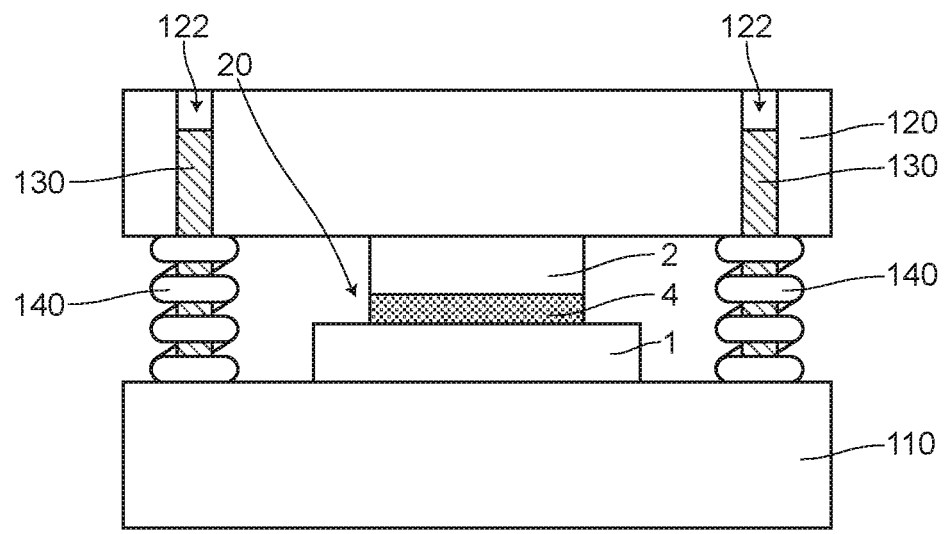
FIG. 4(a) and FIG. 4(b) are views for explaining a third step S30 in the method of manufacturing a bonded body using the pressure applying unit 100 of the embodiment 1.

In the explanation made hereinafter, assume a time during which a pressure is not applied to the pressure applying unit 100 (see FIG. 3(a)) as pressure non-applying time, and assume a time during which predetermined pressure is applied to the pressure applying unit 100 (see FIG. 4(a)) as a pressure applying time.

In this specification, "predetermined pressure" means pressure which is applied to the pressure applying unit 100 in sintering the metal particle paste 4.

The pair of transferring members 110, 120 is constituted of a plate-like first transferring member 110 which is brought into contact with the substrate 1 at least during a pressure applying time and a plate-like second transferring member 120 which is brought into contact with the electronic part at least during a pressure applying time. The pair of transferring members 110, 120 transfers pressure and heat to the assembled body 20 by sandwiching the assembled body 20 therebetween in sintering the metal particle paste 4.

The first transferring member 110 and the second transferring member 120 are made of a ceramic or metal, for example.

The first transferring member 110 and the second transferring member 120 are respectively formed of a plate-like member having a rectangular shape as viewed in a top plan view. In other words, the first transferring member 110 and the second transferring member 120 are respectively formed of a member having a rectangular parallelepiped shape.

In this specification, "plate-like" means not only a completely plate-like shape (only a rectangular parallelepiped shape and a circular columnar shape) but also an approximately plate-like shape as a whole. That is, the transferring member used in the pressure applying unit of the present invention is not limited to the above-mentioned shape, and it is possible to use a transferring member having a shape corresponding to an assembled body or a method of manufacturing a bonded body (for example, assuming a case where a tray on which the pressure applying unit of the present invention is placed exists and an opening portion or a convex/concave portion for fixing the position of the pressure applying unit is formed on the tray, a transferring member having a projecting portion or a cutout whose shape conforms to a shape of the opening portion or the convex/concave portion). Further, a transferring member used in the pressure applying unit of the present invention may include, besides a plate-like member, other members (for example, a spacer, an abutting member having a shape corresponding to a shape of the electronic part and the like) (for example, see an embodiment 2 and a modification described later).

Guide member receiving holes 122 which correspond to the guide members 130 respectively are formed in the second transferring member 120. In the embodiment 1, four guide member receiving holes 122 in total are formed on four corners of the second transferring member 120 such that one guide member receiving hole 122 is formed in each corner of the second transferring member 120. The second transferring member 120 can move along the guide members 130 respectively inserted into the guide member receiving holes 122.

In the technical feature of "the second transferring member can move along the guide members respectively inserted into the guide member receiving holes", "move" means the relative movement of the second transferring member relative to the first transferring member. Depending on the manner of applying pressure to the pressure applying unit, there may be a case where the second transferring member is held stationary and the first transferring member and the guide members are movable as viewed from the outside (for example, a case where a pressure is applied go the pressure applying unit and the assembled body by moving the heating part disposed on a lower side in a direction toward the heating part disposed on an upper side). Also in this case, the second transferring member is moved relative to the first transferring member and hence, such movement is included in the above-mentioned movement.

The guide member receiving hole 122 is a through hole having a circular shape as viewed in a top plan view in conformity with a shape of the guide member 130 (a circular columnar shape as described later). The shape of the guide member receiving hole of the present invention is not limited to a circular shape as viewed in a top plan view, and it is sufficient for the guide member receiving hole to have a shape in conformity with a shape of the guide member. Further, the guide member receiving hole may be a hole (a bottomed hole) other than the through hole.

The guide members 130 connect the pair of transferring members 110, 120 to each other and, at the same time, allow the movement of at least one transferring member out of the first transferring member 110 and the second transferring member 120 while keeping parallelism of one transferring member with the other transferring member. In the embodiment 1, the guide members 130 allow the movement of the second transferring member 120 while keeping parallelism of the second transferring member 120 with the first transferring member 110 (the expression "allow the movement of" being also made by an expression "guide"). From a viewpoint of ensuring stability of the movement of the transferring member, it is preferable for the pressure applying unit of the present invention to include two or more guide members, and more preferably, four or more guide members.

The pressure applying unit 100 includes two or more guide members, specifically, four guide members. When the guide members 130 are viewed in a direction perpendicular to a surface of the first transferring member 110 on which the substrate 1 is arranged, the guide members 130 are arranged at apexes of a predetermined quadrangular shape surrounding a place where the assembled body 20 is to be arranged (see a broken line indicated by symbol Q in FIG. 2(a)). In the embodiment 1, four guide members 130 in total are arranged on four corners of the first transferring member 110 such that one guide member 130 is arranged in each corner of the first transferring member 110.

One end portions of the guide members 130 are respectively fixed to the first transferring member 110. The other end portions of the guide members 130 on a side opposite to one end portions are arranged in the inside of the guide member receiving holes 122 respectively during a pressure applying time (see FIG. 4(*a*) and FIG. 4(*b*)).

The guide members 130 are made of metal such as stainless steel, for example.

In the embodiment 1, all four guide members 130 have a circular columnar shape. The number of guide members used in the present invention is not limited to four, and may be 1 to 3 or 5 or more provided that the guide members can achieve their purpose. Further, the shape of the guide members of the present invention is not limited to a circular columnar shape, and the shape of the guide members may be other shapes (to be more specific, a prismatic shape, an elliptical shape, a flat plate shape, a corrugated shape, an L shape or a T shape) provided that the guide members can achieve their purpose.

The distance adjusting mechanism 140 is a mechanism for adjusting a distance between the first transferring member 110 and the second transferring member 120. In a state where the assembled body 20 is arranged between the pair of transferring members 110, 120, the distance adjusting mechanism 140 makes the first transferring member 110 or the second transferring member 120 separated from the assembled body 20 during a pressure non-applying time, and brings both the first transferring member 110 and the second transferring member 120 into contact with the assembled body 20 during a pressure applying time. The distance adjusting mechanism 140 includes a resilient member which extends during a pressure non-applying time, and shrinks during a pressure applying time. The resilient member is formed of a coil spring, and is arranged using the guide member 130 as a shaft.

The distance adjusting mechanism of the present invention is not limited to the resilient member, and the distance adjusting mechanism may be a member which is configured to shrink when a pressurizing state of the distance adjusting mechanism is shifted to a pressure applying time from a pressure non-applying time but does not extend when the pressurizing state is shifted from the pressure applying time to the pressure non-applying time (for example, a multi-stage pipe having the telescopic structure).

Further, the resilient member of the present invention is not limited to a coil spring, a member which can withstand a temperature at the time of sintering a metal particle paste may be used. As a specific example of the resilient member other than the coil spring, a leaf spring and heat resistance rubber can be named.

The distance adjusting mechanism of the present invention may include a constitutional element other than the resilient member (for example, a member which supports the resilient member or a member which reinforces the resilient member).

In this specification, the expression "arranged using the guide member as a shaft" is used with respect to the coil spring. This expression means that the coil spring is arranged in a state where the guide member is disposed in a hollow portion of the coil spring.

The resilient member of the present invention may be arranged at a position different from a position where the guide member is arranged. Further, the resilient member of the present invention may be arranged using a constitutional element other than the guide member as a shaft. Only the resilient member may be arranged (without using a shaft).

Next, a method of manufacturing a bonded body using the pressure applying unit 100 according to the embodiment 1 is simply explained.

The method of manufacturing the above-mentioned bonded body includes following steps, that is, a first step S10, a second step S20, and a third step S30 in this order.

The first step S10 is a step where the assembled body 20 is prepared. This step is substantially equal to the step shown in FIG. 7 and hence, the illustration of the step is omitted.

The first step S10 can be performed such that, for example, after preparing the substrate 1, the electronic part 2 and the metal particle paste 4, the metal particle paste 4 is applied by coating to a predetermined place of the substrate 1 (for example, contact points with the electronic part 2), and the electronic part 2 is arranged on the place.

Figure 3B:
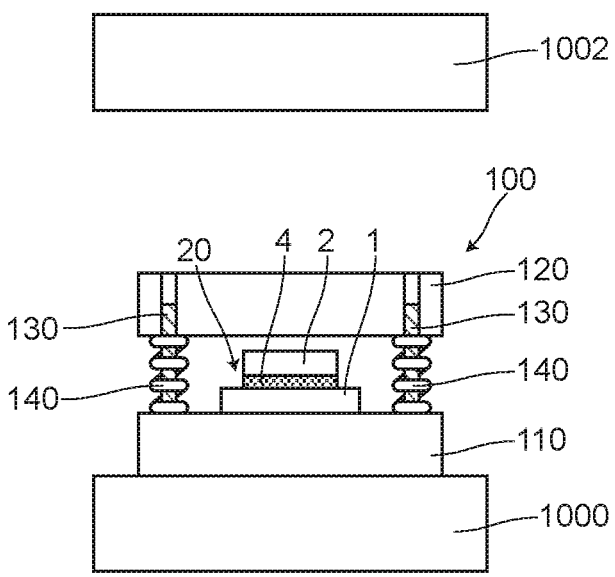

As shown in FIG. 3(*a*) and FIG. 3(*b*), the second step S20 is a step where the assembled body 20 is sandwiched between the pair of transferring members 110, 120 of the pressure applying unit 100 and, thereafter, the assembled body 20 is arranged between the pair of heating parts 1000, 1002 together with the pressure applying unit 100.

In the second step S20 of the embodiment 1, although the assembled body 20 and the pressure applying unit 100 are directly arranged on the heating part 1000, the assembled body 20 and the pressure applying unit 100 may be arranged between the pair of heating parts 1000, 1002 (that is, in a spaced-apart manner from the heating part 1000).

Figure 4B:
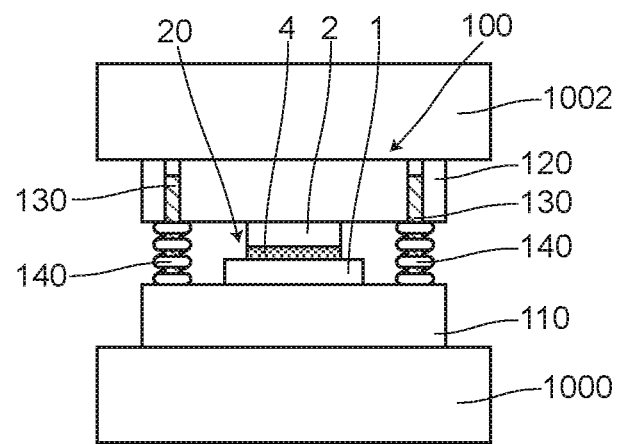

As shown in FIG. 4(*b*), the third step S30 is a step where the heating part 1002 disposed on an upper side is moved toward the heating part 1000, and the metal particle paste 4 is baked by heating the assembled body 20 together with the pressure applying unit 100 using a pair of heating parts 1000, 1002 while applying a pressure to the assembled body 20 thus manufacturing the bonded body 10.

In the third step S30 of the embodiment 1, the heating part 1002 is moved. However, the heating part 1000 may be moved or both heating parts 1000, 1002 may be moved.

Hereinafter, advantageous effects of the pressure applying unit 100 according to the embodiment 1 are explained.

According to the pressure applying unit 100 of the embodiment 1, the pressure applying unit includes the pair of transferring members 110,120. Accordingly, by interposing the transferring members between the assembled body and the pair of heating members during a pressure applying time, unintended heat conduction to the metal particle paste from the heating part can be suppressed and hence, it is possible to suppress the occurrence of a partial sintering reaction of the metal particle paste. As a result, it is possible to suppress the lowering of bonding property between the substrate and the electronic part.

Further, according to the pressure applying unit 100 of the embodiment 1, the pressure applying unit 100 suppresses unintended heat conduction to the metal particle paste 4 from the heating parts 1000, 1002 as described above. Accordingly, it is possible to arrange the assembled body without changing a temperature of the heating part thus preventing remarkable lowering of productivity of a bonded body.

Accordingly, the pressure applying unit 100 according to the embodiment 1 forms a pressure applying unit which can be used in a method of manufacturing a bonded body capable of suppressing the lowering of bonding property between the substrate 1 and the electronic part 2 and capable of preventing remarkable lowering of productivity of a bonded body.

Further, the pressure applying unit 100 of the embodiment 1 includes the guide member 130. Accordingly, even when the pair of transferring members is moved due to applying of pressure, parallelism between the pair of transferring members can be kept. As a result, it is possible to suppress the occurrence of irregularities in bonding strength between the substrate and the electronic part depending on places.

The pressure applying unit 100 of the embodiment 1 includes the distance adjusting mechanism 140. Accordingly, it is possible to prevent the transfer of vibrations or an impact applied to the pair of transferring members to the assembled body during a pressure non-applying time. As a result, it is possible to reduce the displacement of the positional relationship between the substrate and the electronic part.

Further, in the pressure applying unit 100 of the embodiment 1, the distance adjusting mechanism 140 includes the resilient member which extends during the pressure non-applying time, and shrinks during the pressure applying time.

Accordingly, when applying of pressure to the pressure applying unit is released after baking a metal particle paste, the pair of transferring members can be automatically spaced apart from each other and, as a result, the assembled body can be easily taken out.

Further, in the pressure applying unit 100 of the embodiment 1, the resilient member is formed of a coil spring, and is arranged using the guide member as a shaft. Accordingly, the distance adjusting mechanism can be realized with the simple structure.

Further, in the pressure applying unit 100 of the embodiment 1, one end portions of the guide members 130 are fixed to the first transferring member 110, the guide member receiving holes 122 which conform to the guide members 130 are formed in the second transferring member 120, and the second transferring member 120 is movable along the guide members 130 inserted into the guide member receiving hole 122. Accordingly, it is possible to move the second transferring member using the simple configuration with high accuracy.

Further, in the pressure applying unit 100 of the embodiment 1, the other end portions of the guide members 130 are disposed in the guide member receiving holes 122 during the pressure applying time. Accordingly, it is possible to prevent the guide members from coming into contact with the heating parts and hence, it is possible to apply pressure to the pressure applying unit in a stable manner.

Further, in the pressure applying unit 100 of the embodiment 1, the pressure applying unit 100 includes four or more guide members 130, and the guide members 130 are arranged at least at apexes of a predetermined quadrangular shape Q surrounding a place where the assembled body 20 is to be arranged. Accordingly, the parallelism between the pair of transferring members can be kept with high accuracy by four guide members arranged at apexes of a predetermined quadrangular shape.

Embodiment 2

Figure 5A:
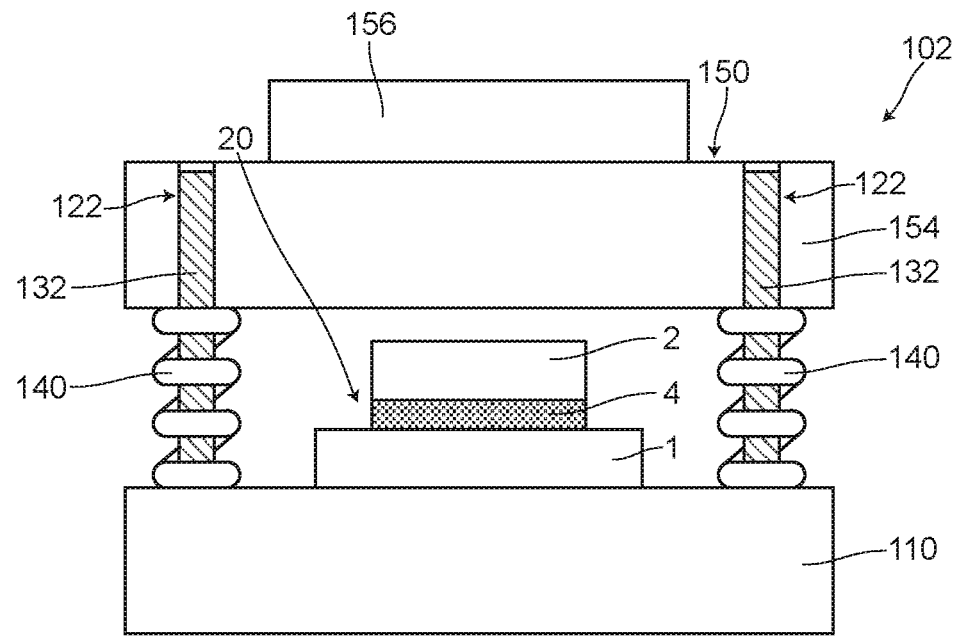
FIG. 5(a) and FIG. 5(b) are views for explaining a pressure applying unit 102 of an embodiment 2.
Figure 5B:
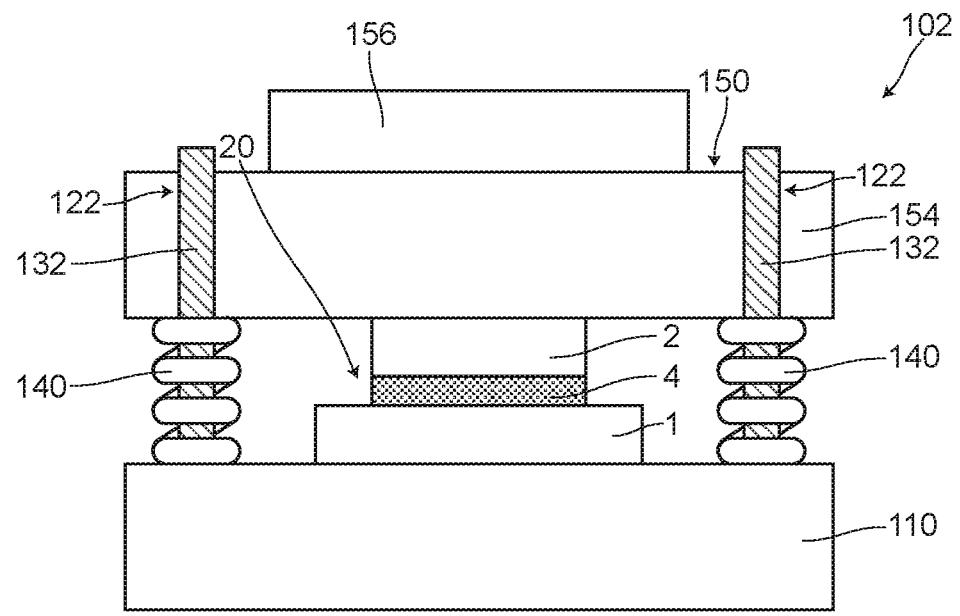

A pressure applying unit 102 of an embodiment 2 has substantially the same configuration as the pressure applying unit 100 of the embodiment 1. However, the pressure applying unit 102 is different from the pressure applying unit 100 of the embodiment 1 with respect to the configuration of the second transferring member and the configuration of the guide members. That is, as shown in FIG. 5(b), in the pressure applying unit 102 of the embodiment 2, the other end portion of the guide member 132 disposed on a side opposite to one end portion of the guide member 132 is configured to project from the guide member receiving hole 122 toward a side of the second transferring member 150 on a side opposite to the first transferring member 110, and the second transferring member 150 further includes a spacer 156 having a thickness larger than a length by which the guide member 132 projects from the guide member receiving hole 122 on a side of the second transferring member 150 where the guide member 132 projects.

The second transferring member 150 includes a member 154 having a rectangular parallelepiped member and the spacer 156.

The member 154 having a rectangular parallelepiped shape is a member substantially equal to the member having a rectangular parallelepiped shape which forms the second transferring member 120 of the embodiment 1.

The spacer 156 is made of the same material as the member 154 having a rectangular parallelepiped shape. The spacer 156 may be completely fixed to the member 154 having a rectangular parallelepiped shape or may be detachably mounted on the member 154 having a rectangular parallelepiped shape. The spacer 156 has a rectangular parallelepiped shape and is one size smaller than the member 154 having a rectangular parallelepiped shape. Although one spacer 156 is used in the embodiment 2, a plurality of spacers 156 may be used. When a plurality of spacers 156 are used, one spacer 156 may be made to overlap to another spacer 156. Further, in the embodiment 2, although the spacer 156 has a rectangular parallelepiped shape and is one size smaller than the member 154 having a rectangular parallelepiped shape. However, the spacer of the present invention may have a shape (a circular columnar shape, a prismatic shape or the like) other than the above-mentioned shape. Further, the spacer may be formed of a solid body or may be formed of a hollow body having a space in the inside thereof.

The guide member 132 has substantially the same configuration as the guide member 130 of the embodiment 1. However, the guide member 132 is longer than the guide member 130.

As described above, the pressure applying unit 102 of the embodiment 2 differs from the pressure applying unit 100 of the embodiment 1 with respect to the configuration of the second transferring member and the configuration of the guide member. However, the pressure applying unit 102 of the embodiment 2 is a pressure applying unit which is used in a method of manufacturing a bonded body which includes the pair of transferring members, can suppress the lowering of bonding property between the substrate and the electronic part in the same manner as the pressure applying unit 100 according to the embodiment 1 for suppressing unintended heat conduction to the metal particle paste from the heating part, and can prevent remarkable lowering of productivity of assembled bodies.

Further, according to the pressure applying unit 102 according to the embodiment 2, the second transferring member 150 includes the spacer 156 and hence, it is possible to prevent the guide member from coming into contact with the heating part whereby it is possible to stably apply pressure to the pressure applying unit.

The pressure applying unit 102 according to the embodiment 2 basically has substantially the same configuration as the pressure applying unit 100 according to the embodiment 1 except for the configuration of the second transferring member and the configuration of the guide member. Accordingly, the pressure applying unit 102 according to the embodiment 2 can acquire advantageous effects which correspond to the advantageous effects out of the advantageous effects which the pressure applying unit 100 according to the embodiment 1 can acquire.

Although the present invention has been explained heretofore by reference to the above-mentioned respective embodiments, the present invention is not limited to the above-mentioned respective embodiments. Various modifications are conceivable without departing from the gist of the present invention. For example, the following modifications are also conceivable.

(1) The number, materials, shapes, positions, sizes and the like of the constitutional elements described in the above-mentioned respective embodiments are merely examples, and can be changed within a range where the advantageous effects of the present invention are not impaired.

Figure 6A:
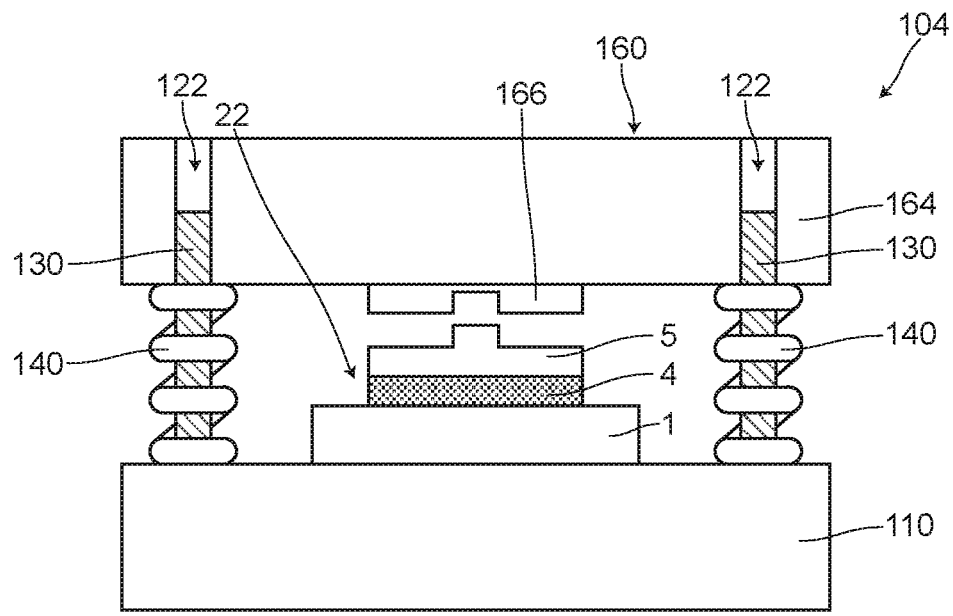
FIG. 6(a) and FIG. 6(b) are views for explaining a pressure applying unit 104 according to a modification.
Figure 6B:
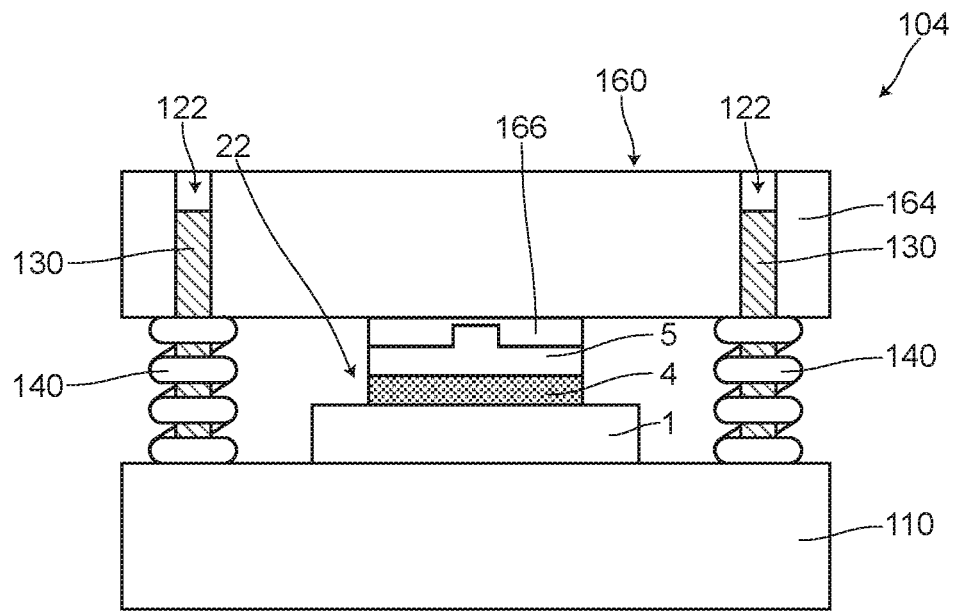

(2) In the above-mentioned embodiment 1, the present invention has been explained using the first transferring member 110 and the second transferring member 120 which are respectively formed of a member having a rectangular parallelepiped shape. However, the present invention is not limited to such a configuration. As shown in FIG. 6(*a*) and FIG. 6(*b*), a pressure applying unit 104 according to a modification is a pressure applying unit which is used in baking a metal particle paste 4 by heating an assembled body 22 which is formed by arranging an electronic part 5 on a substrate 1 with the metal particle paste 4 interposed therebetween using a pair of heating parts while applying a pressure to the assembled body 22. The electronic part 5 is basically substantially equal to the electronic part 2 of the embodiment 1. However, the electronic part 5 has a projecting portion on a side thereof opposite to a substrate 1 side. A second transferring member 160 of the pressure applying unit 104 basically has substantially the same configuration as the second transferring member 120 of the embodiment 1. However, the second transferring member 160 includes a member 164 having a rectangular parallelepiped shape and an abutting member 166. The member 164 having a parallelepiped shape is a member substantially equal to the member having a rectangular parallelepiped shape which forms the second transferring member 120 of the embodiment 1, and the abutting member 166 is a member having a recessed portion on a first transferring member 110 side thereof. The recessed portion of the abutting member 166 corresponds to the projecting portion of the electronic part 5. For example, as shown in the modification, the transferring member used in the pressure applying unit according to the present invention may have a member other than the plate-like member or the spacer.

REFERENCE SIGNS LIST

1: substrate, 2, 5: electronic part, 3: baked metal particle paste, 4: metal particle paste, 10: bonded body, 20, 22: assembled body, 100, 102, 104: pressure applying unit, 110: first transferring member, 120, 150, 160: second transferring member, 122: guide member receiving hole, 130, 132: guide member, 140: distance adjusting mechanism, 154, 164: member having rectangular parallelepiped shape, 156: spacer, 166: abutting member, 1000, 1002: heating part, Q: predetermined quadrangular shape

The invention claimed is:

1. A pressure applying unit used in baking a metal particle paste of an assembled body formed by arranging an electronic part on a substrate with the metal particle paste interposed therebetween by heating the assembled body while applying pressure to the assembled body using a pair of heating parts, wherein
a time during which pressure is not applied to the pressure applying unit is defined as a pressure non-applying time and a time during which predetermined pressure is applied to the pressure applying unit is defined as a pressure applying time,
the pressure applying unit comprises:
a pair of transferring members which is constituted of a plate-like first transferring member being in contact with the substrate at least during the pressure applying time and a plate-like second transferring member being in contact with the electronic part at least during the pressure applying time and transfers pressure and heat to the assembled body by sandwiching the assembled body therebetween in sintering the metal particle paste;
a guide member which connects the pair of transferring members to each other, and allows the movement of at least one transferring member out of the first transferring member and the second transferring member while keeping parallelism of one transferring member with the other transferring member; and
a distance adjusting mechanism for adjusting a distance between the first transferring member and the second transferring member, the distance adjusting mechanism being configured to, in a state where the assembled body is arranged between the pair of transferring members, make the first transferring member or the second transferring member separated from the assembled body during the pressure non-applying time and brings both the first transferring member and the second transferring member into contact with the assembled body during the pressure applying time,
wherein the distance adjusting mechanism includes a resilient member which extends during the pressure non-applying time, and shrinks during the pressure applying time.

2. The pressure applying unit according to claim 1, wherein the resilient member is formed of a coil spring, and is arranged using the guide member as a shaft.

3. The pressure applying unit according to claim 1, wherein one end portion of the guide member is fixed to the first transferring member,
a guide member receiving hole which conforms to the guide member is formed in the second transferring member, and
the second transferring member is movable along the guide member inserted into the guide member receiving hole.

4. The pressure applying unit according to claim 3, wherein the other end portion of the guide member disposed on a side opposite to said one end portion of the guide member is disposed in the guide member receiving hole during the pressure applying time.

5. The pressure applying unit according to claim 3, wherein the other end portion of the guide member disposed on a side opposite to said one end portion of the guide member is configured to project from the guide member receiving hole toward a side of the second transferring member on a side opposite to the first transferring member during the pressure applying time, and
the second transferring member further includes a spacer having a thickness larger than a length by which the guide member projects from the guide member receiving hole on a side of the second transferring member where the guide member projects.

6. A pressure applying unit used in baking a metal particle paste of an assembled body formed by arranging an electronic part on a substrate with the metal particle paste interposed therebetween by heating the assembled body while applying pressure to the assembled body using a pair of heating parts, wherein a time during which pressure is not applied to the pressure applying unit is defined as a pressure non-applying time and a time during which predetermined pressure is applied to the pressure applying unit is defined as a pressure applying time, the pressure applying unit comprises:

a pair of transferring members which is constituted of a plate-like first transferring member being in contact with the substrate at least during the pressure applying time and a plate-like second transferring member being in contact with the electronic part at least during the pressure applying time and transfers pressure and heat to the assembled body by sandwiching the assembled body therebetween in sintering the metal particle paste;

a guide member which connects the pair of transferring members to each other, and allows the movement of at least one transferring member out of the first transferring member and the second transferring member while keeping parallelism of one transferring member with the other transferring member; and a distance adjusting mechanism for adjusting a distance between the first transferring member and the second transferring member, the distance adjusting mechanism being configured to, in a state where the assembled body is arranged between the pair of transferring members, make the first transferring member or the second transferring member separated from the assembled body during the pressure non-applying time and brings both the first transferring member and the second transferring member into contact with the assembled body during the pressure applying time, wherein the pressure applying unit includes four or more guide members, and when the guide members are viewed in a direction perpendicular to a surface of the first transferring member on which the substrate is arranged, the guide members are arranged at least at apexes of a predetermined quadrangular shape surrounding a place where the assembled body is to be arranged.

* * * * *